(12) United States Patent
Koji et al.

(10) Patent No.: US 8,044,452 B2
(45) Date of Patent: Oct. 25, 2011

(54) SEMICONDUCTOR DEVICE AND METHOD FOR MANUFACTURING THE SAME

(75) Inventors: Tominaga Koji, Kyoto (JP); Iwamoto Kunihiko, Kyoto (JP); Yasuda Tetsuji, Ibaraki (JP); Nabatame Toshihide, Tokyo (JP)

(73) Assignee: Rohm Co., Ltd. (JP)

( * ) Notice: Subject to any disclaimer, the term of this patent is extended or adjusted under 35 U.S.C. 154(b) by 547 days.

(21) Appl. No.: 10/550,645

(22) PCT Filed: Mar. 18, 2004

(86) PCT No.: PCT/JP2004/003631
§ 371 (c)(1),
(2), (4) Date: Aug. 23, 2006

(87) PCT Pub. No.: WO2004/086510
PCT Pub. Date: Oct. 7, 2004

(65) Prior Publication Data
US 2007/0170502 A1    Jul. 26, 2007

(30) Foreign Application Priority Data
Mar. 24, 2003   (JP) ................ 2003-079290

(51) Int. Cl.
*H01L 29/94* (2006.01)
*H01L 29/792* (2006.01)

(52) U.S. Cl. ........ 257/324; 257/310; 257/325; 257/406; 257/411; 257/E21.639; 438/216; 438/240; 438/261; 438/287; 438/591

(58) Field of Classification Search .......... 257/190–195, 257/201–202, 211, 213, 288, 310, 314–316, 257/324–327, 368–369, 406, 409–413, E21.639, E51.006, E27.06, E27.108, E29.126, E29.129, E29.13, E29.137, E29.14, E29.158, E29.16, E29.228, E21.457, 67, 205; 438/142, 149, 151–154, 167, 169, 172, 174, 178, 197, 199, 201, 211, 216, 240, 257, 261, 263–264, 287, 591, 594, 682, FOR. 202
See application file for complete search history.

(56) References Cited

U.S. PATENT DOCUMENTS
6,020,243 A   2/2000  Wallace et al.
(Continued)

FOREIGN PATENT DOCUMENTS
EP         0825640 A2     2/1998
(Continued)

OTHER PUBLICATIONS

Korean Notification of Rejection Reason for corresponding Korean application issued Dec. 4, 2006 with English abstract.
(Continued)

*Primary Examiner* — Matthew Landau
*Assistant Examiner* — Maliheh Malek
(74) *Attorney, Agent, or Firm* — Cantor Colburn LLP

(57) ABSTRACT

The present invention provides a high-quality semiconductor device in which deterioration in transistor characteristics and an increase in interface layer due to a gate insulating film are suppressed, and a method for manufacturing the same. In the present invention, an interface layer, a diffusion suppressing layer and a high dielectric constant insulating film are formed sequentially in this order on one surface of a silicon substrate.

9 Claims, 3 Drawing Sheets

U.S. PATENT DOCUMENTS

| | | | |
|---|---|---|---|
| 6,642,131 B2 * | 11/2003 | Harada | 438/591 |
| 6,642,573 B1 | 11/2003 | Halliyal et al. | |
| 6,867,101 B1 * | 3/2005 | Yu | 438/287 |
| 7,482,234 B2 * | 1/2009 | Iwamoto et al. | 438/287 |
| 7,790,627 B2 * | 9/2010 | Iwamoto et al. | 438/775 |
| 7,884,423 B2 * | 2/2011 | Iwamoto et al. | 257/369 |
| 2001/0013629 A1 * | 8/2001 | Bai | 257/411 |
| 2002/0047170 A1 | 4/2002 | Ota | |
| 2002/0106536 A1 | 8/2002 | Lee et al. | |
| 2002/0130340 A1 * | 9/2002 | Ma et al. | 257/295 |
| 2002/0195643 A1 * | 12/2002 | Harada | 257/310 |
| 2003/0218223 A1 * | 11/2003 | Nishiyama et al. | 257/410 |
| 2006/0115993 A1 * | 6/2006 | Doh et al. | 438/762 |
| 2006/0138603 A1 * | 6/2006 | Cabral et al. | 257/635 |
| 2008/0251828 A1 * | 10/2008 | Meng et al. | 257/304 |

FOREIGN PATENT DOCUMENTS

| | | |
|---|---|---|
| EP | 1124262 A2 | 8/2001 |
| EP | 1271632 A1 | 1/2003 |
| GB | 2347265 A | 8/2000 |
| JP | 2001-267566 | 9/2001 |
| JP | 2002-246594 | 8/2002 |
| JP | 2002-324901 | 11/2002 |
| JP | 2002-359370 | 12/2002 |
| JP | 2003-68731 | 3/2003 |

OTHER PUBLICATIONS

European Search Report for Patent Application No. 04721671.8-2203/1610393, PCT/JP2004003631; Date of mailing Jan. 29, 2009.
International Search Report for International Application No. PCT/JP2004/003631 dated Jun. 22, 2004.

* cited by examiner

SEMICONDUCTOR DEVICE AND METHOD FOR MANUFACTURING THE SAME

This is a U.S. national stage of application No. PCT/JP2004/003631, filed on 18 Mar. 2004. Priority under 35 U.S.C. §119(a) and 35 U.S.C. §365(b) is claimed from Japanese Application No. 2003-79290, filed 24 Mar. 2003, the disclosure of which is also incorporated herein by reference.

TECHNICAL FIELD

The present invention relates to a semiconductor device and a method for manufacturing the same, and particularly relates to a semiconductor device as a MIS (Metal Insulator Semiconductor) transistor in which a metal oxide film or the like is formed as a gate insulating film on a silicon substrate, and a method for manufacturing the same.

BACKGROUND ART

In recent years, with the increase in integration of semiconductors, a material for use in a gate insulating film of a MIS transistor has been shifted from $SiO_2$, obtained by oxidizing a conventional silicon substrate (Si substrate), to a material (high-k) having a larger dielectric constant. However, there are problems with the high-k material in that the dielectric constant of the high-k material decreases due to mutual diffusion of the high-k material and the Si substrate, and further, the diffusion layer increases due to heat treatment performed in the transistor production process.

In order to solve the problems as described above, for example, a technique has been proposed which is described in Japanese Patent Laid-Open No. 2002-43565. This is a technique in which a $Si_3N_4$ film obtained by nitriding Si is once formed on a Si substrate and then a high-k film is formed so that the mutual diffusion of the Si substrate and the high-k material can be prevented.

However, in the technique described in the above-mentioned publication, there has occurred a problem of deterioration in transistor characteristics due to the existence of nitrogen in the vicinity of the Si interface, and this has prevented certain production of a high-quality MIS transistor.

The present invention was made, taking note of the foregoing matters, and has an object to provide a high-quality semiconductor device in which deterioration in transistor characteristics and an increase in interface layer due to a gate insulating film are suppressed, and a method for manufacturing the same.

DISCLOSURE OF THE INVENTION

For achieving the above-mentioned object, a semiconductor device of the present invention is characterized in that an interface layer, a diffusion suppressing layer and a high dielectric constant insulating film are sequentially formed in this order on one surface of a silicon substrate (claim 1).

In the semiconductor device, for example, between a Si substrate comprising a Si monocrystal and a high dielectric constant insulating film (high-k insulating film) formed on one surface side of the Si substrate, an oxide, which was formed so as to be mutually diffused with the Si substrate and is constituted of Si and a metal element constituting high-k, is formed as an interface layer. Further, since a diffusion suppressing layer for suppressing diffusion of the interface layer into the high-k insulating film is formed on the upper surface of the interface layer, only the metal element constituting high-k, the oxygen element and Si exist in the interface layer, thereby not causing deterioration in transistor characteristics. Moreover, in the semiconductor device, due to the existence of the diffusion suppressing layer, the thickness of the interface layer is not increased even by heat treatment in the transistor production process, thereby allowing the semiconductor device to have high quality.

In the semiconductor device, it is preferable that the interface layer have a thickness (equivalently converted $SiO_2$ thickness) of 1.0 nm or smaller (claim 2). Further, the constitutional element of the high dielectric constant insulating film may be made the same as part of the constitutional elements of the interface layer (claim 3).

Moreover, for achieving the above-mentioned object, a method for manufacturing a semiconductor device according to the present invention is characterized by comprising: forming an initial layer on one surface of a silicon substrate; forming a diffusion suppressing layer on the surface of the initial layer; performing heat treatment to allow the initial layer to become an interface layer mutually diffused with the silicon substrate; and forming a high dielectric constant insulating film on the surface of the diffusion suppressing layer (claim 4).

According to the above-mentioned method for manufacturing a semiconductor device, it is possible to certainly obtain a high quality semiconductor device.

Furthermore, for achieving the above-mentioned object, a method for manufacturing a semiconductor device according to the present invention is characterized by comprising: forming an initial layer on one surface of a silicon substrate; forming a diffusion suppressing layer on the surface of the initial layer; forming a high dielectric constant insulating film on the surface of the diffusion suppressing layer; and performing heat treatment to allow the initial layer to become an interface layer mutually diffused with the silicon substrate. (claim 5).

According to the above-mentioned method for manufacturing a semiconductor device, the following effect is obtained in addition to the effect of the method for manufacturing a semiconductor device according to claim 4. Namely, application of ALD (Atomic Layer Deposition) as a technique for the film formation enables continuous processing in a single chamber, eliminating the need for preparing a plurality of chambers.

BEST MODE FOR CARRYING OUT THE INVENTION

Figure 1:
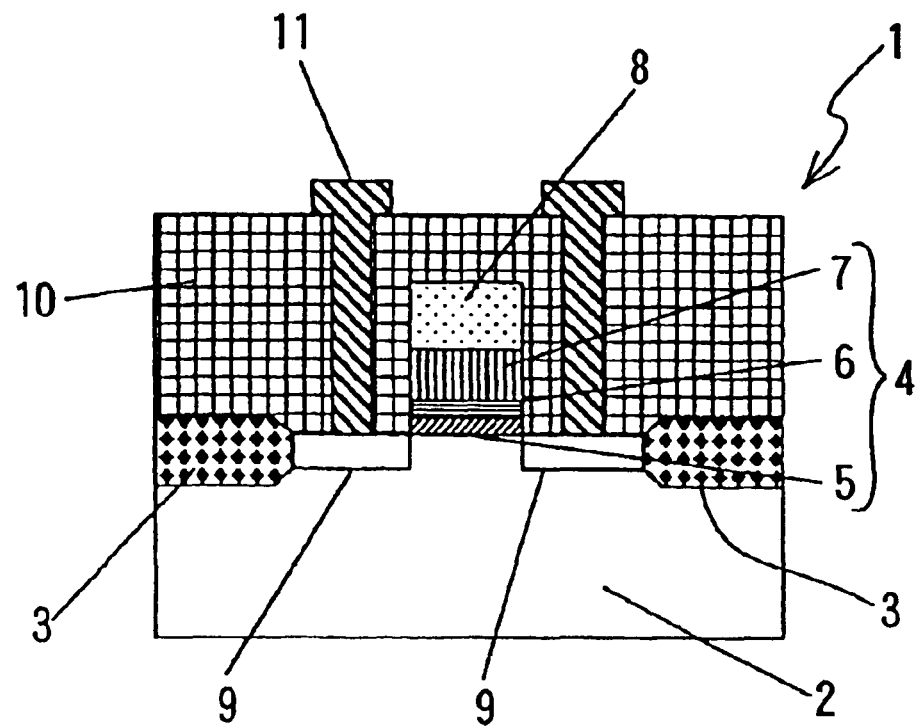
FIG. 1 is a vertical sectional view schematically showing a configuration of a MIS transistor as a semiconductor device of the present invention.

Embodiments of the present invention are described with respect to drawings. First, FIG. 1 is a view schematically showing a configuration of a MIS transistor 1 as a semiconductor device of the present invention. In this figure, reference numeral 2 denotes a Si monocrystal substrate (hereinafter simply referred to as a Si substrate), and the resistivity thereof is from 0.01 to 15Ω·cm, for example. Reference numeral 3 denotes an element isolation oxide film for isolating elements, which is formed by thermal oxidation of the Si substrate 2. Reference numeral 4 denotes a gate insulating film, which is composed of an interface layer 5, a diffusion suppressing layer 6 and a high-k film 7. A method for forming the gate insulating film 4 is specifically described later.

Reference numeral 8 denotes a gate electrode to be formed on the upper surface of the gate insulating film 4, and for example, the gate electrode 8 is made of a noble metal such as Pt (platinum) or a high melting point metal such as TiN or TaN, the noble metal and the high melting point metal not reacting with a polycrystal Si film, a polycrystal SiGe film or the gate insulating film 4. Reference numeral 9 denotes a channel region, and P (phosphorous) is injected into an n channel while B (boron) is injected into a p channel, respectively, and those channels are heat treated at temperatures of 800 to 1,000° C. for 10 to 30 minutes to be activated. Reference numeral 10 denotes an interlayer insulating film, which for example comprises $SiO_2$ and is formed by CVD (Chemical Vapor Deposition) or the like. Reference numeral 11 denotes an extraction electrode, which for example comprises Al and serves as a source/drain electrode. It is to be noted that patterning is performed for example by means of the photolithography technique.

Figure 2:
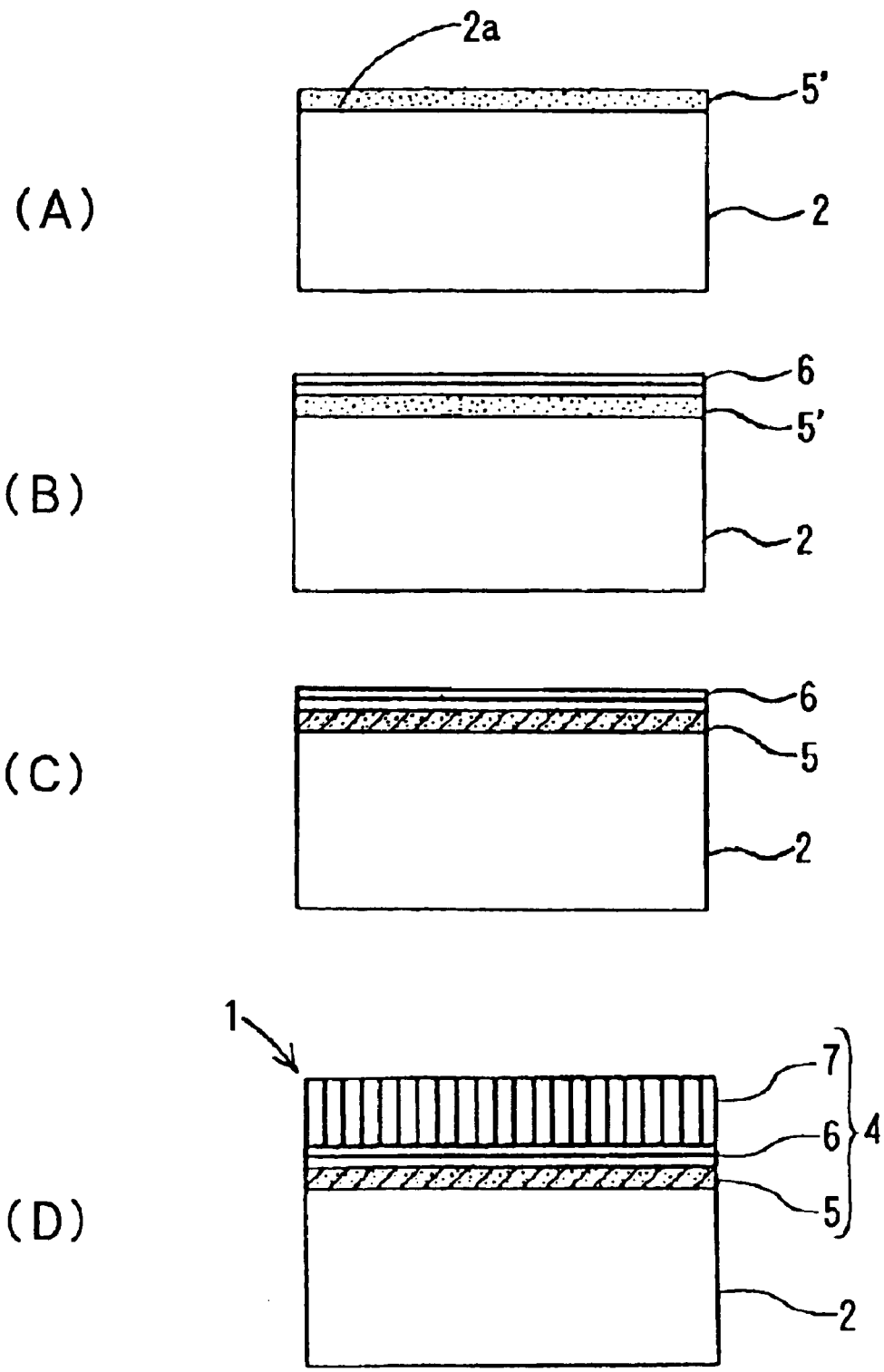
FIG. 2 is a view showing one example of methods for forming a gate insulating film in the semiconductor device.

Next, a first technique for forming the gate insulating film 4 is described with reference to FIG. 2.

(11) First, as shown in FIG. 2(A), as an initial layer (also referred to as a first layer) 5' to be mutually diffused with Si on one surface 2a of the Si substrate 2 made of a Si monocrystal plate having an appropriate thickness (e.g. about 500 μm), a thin film comprising $HfO_2$ (hafnium oxide) and having a thickness of about 0.5 nm is formed. There are various kinds of known methods as means for forming the initial layer 5', such as CVD (Chemical Vapor Deposition), ALD, and sputtering.

(12) Next, as shown in FIG. 2(B), an AlN film having a thickness of 0.5 to 5 nm as a metal nitride film or $AlO_xN_y$ film (y>0) having a thickness of 0.5 to 5 nm as a metal oxide nitride film is formed as the diffusion suppressing film 6 on the upper surface of the initial layer 5'.

In this case, the AlN film may be formed by ALD by alternately supplying precursor of TMA (trimethyl aluminum: $Al(CH_3)_3$) and an ammonia ($NH_3$) gas or may be formed by sputtering in a nitrogen containing gas atmosphere. Further, $AlO_xN_y$ film may be formed by heat treating an $Al_2O_3$ film, having being formed by ALD by alternately supplying precursor of TMA and a water vapor ($H_2O$) gas, in a $NH_3$ gas atmosphere, or may be formed by treating the $Al_2O_3$ film, having being formed by the above-mentioned technique, in a plasma nitrogen atmosphere.

(13) Subsequently, Si in the Si substrate 2 and $HfO_2$ as the initial layer 5' are mutually diffused by heat treatment (about 800° C.), and as shown in FIG. 2(C), $HfSiO_4$ (hafnium silicate)5 is formed as the interface layer.

(14) Thereafter, an $HfO_2$ film having a thickness of about 5 nm is formed as the high-k film 7 on the upper surface of the diffusion suppressing film 6 so that the gate insulating film 4, having a triple layered configuration of the interface layer 5, the diffusion suppressing film 6, and the high-k film 7, can be formed on one surface 2a of the Si substrate 2, as shown in FIG. 2(D). The $HfO_2$ film as the high-k film 7 may be formed by any of CVD, ALD and sputtering.

In the gate insulating film 4 of the semiconductor device 1 formed as thus described, the thickness of the interface layer 5 is not increased even by heat treatment in the transistor production process since the diffusion suppressing film 6 excellent in electric insulation is formed between the interface layer 5 and the high-k film 7. Further, diffusion of oxygen from the inside of the high-k film 7 toward the side of the interface layer 5 is suppressed due to the existence of the diffusion suppressing film 6, and it is consequently possible to effectively prevent impairment of the high-k characteristics. Therefore, the gate insulating film 4 of the semiconductor device 1 has high quality, and according to the production method therefor, it is possible to certainly produce the high-quality gate insulating film 4 of the semiconductor device 1.

It is to be noted that, although the high-k film 7 was formed of the $HfO_2$ film in the foregoing embodiment, a $ZrO_2$ or $TiO_2$ film may be used in place of the $HfO_2$ film and the interface layer 5 may comprise $ZrSiO_4$ or $TiSiO_4$, respectively, or further, the high-k film 7 may be formed of a high-k film compound of $HfO_2$ and $Al_2O_3$ or the like ($HfAlO_{1.61-x}$, in this case) and the initial layer 5' may comprise $HfO_2$ while the interface layer 5 may comprise $HfSiO_4$, so that the constitutional element of the high-k film 7 as a high dielectric constant insulating film may be constituted to be the same as part of the constitutional elements of the interface layer 5.

Figure 3:
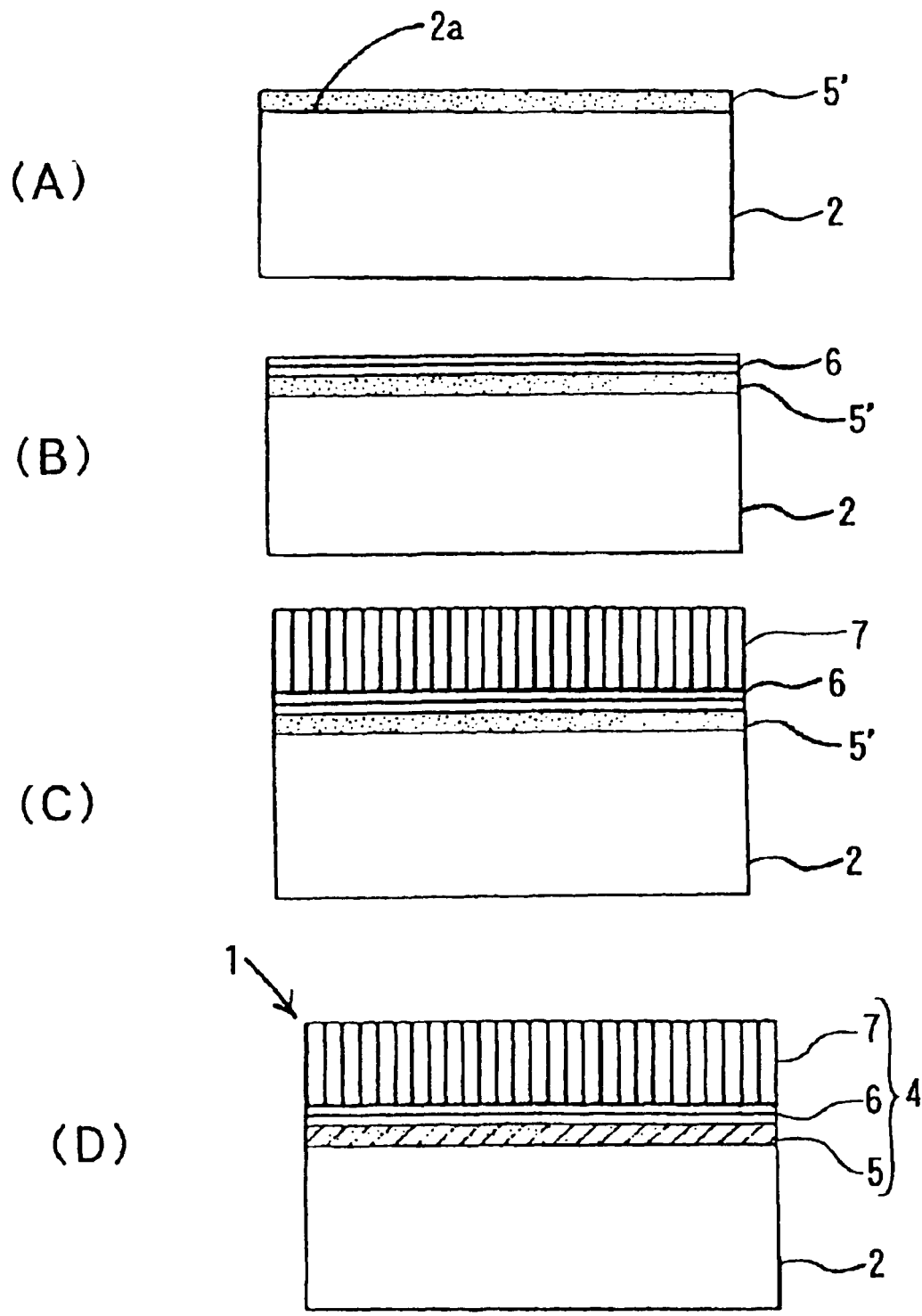
FIG. 3 is a view showing another example of methods for forming a gate insulating film in the semiconductor device.

FIG. 3 is a view schematically showing a second technique for forming the gate insulating film 4.

(21) First, as shown in FIG. 3(A), as an initial layer 5' to be mutually diffused with Si on one surface 2a of the Si substrate 2 made of a Si monocrystal plate having an appropriate thickness (e.g. about 500 μm), a thin film comprising $HfO_2$ and having a thickness of about 0.5 nm is formed. As means for forming the initial layer 5' employed is ALD by alternately supplying precursor of $Hf[N(CH_3)_2]_4$ and a water vapor gas. The substrate temperature at this time is from 250 to 350° C., and the number of cycles for the film formation is four.

(22) Next, the supplied gases are replaced, and by ALD by alternately supplying precursor of TMA and an ammonia gas, an AlN film having a thickness of 0.5 nm is formed as the diffusion suppressing film 6 on the upper surface of the initial layer 5', as shown in FIG. 3(B). The substrate temperature at this time is from 250 to 350° C., and the number of cycles for the film formation is five.

(23) Subsequently, as shown in FIG. 3(C), an $HfO_2$ film having a thickness of about 5 nm is formed as the high-k film 7 on the upper surface of the diffusion suppressing film 6. As means for forming the high-k film 7 employed is ALD by alternately supplying precursor of $Hf[N(CH_3)_2]_4$, and a water vapor gas. Namely, the means is the same as that of (21) above. The substrate temperature at this time is from 250 to 350° C., and the number of cycles for the film formation is forty.

(24) Finally, Si in the Si substrate 2 and $HfO_2$ as the initial layer 5' are mutually diffused by heat treatment (about 800° C., 60 seconds), and as shown in FIG. 3(D), $HfSiO_4$ 5 is formed as the interface layer, so that the gate insulating film 4, having a triple layered configuration of the interface layer 5, the diffusion suppressing film 6, and the high-k film 7, can be formed on one surface 2a of the Si substrate 2.

Also in the gate insulating film 4 of the semiconductor device 1 formed as thus described, the thickness of the interface layer 5 is not increased even by heat treatment in the transistor production process since the diffusion suppressing film 6 excellent in electric insulation is formed between the interface layer 5 and the high-k film 7. Further, diffusion of oxygen from the inside of the high-k film 7 toward the side of the interface layer 5 is suppressed due to the existence of the diffusion suppressing film 6, and it is consequently possible to effectively prevent impairment of the high-k characteristics. Therefore, the gate insulating film 4 of the semiconductor device 1 has high quality.

Further, according to the method for forming the gate insulating film 4 as shown in FIG. 3, the formation of each of the films 5', 6 and 7 by ALD enables the film formation to be continuously performed in a single chamber, eliminating the need for preparing a plurality of devices and chambers, whereby it is possible to reduce the production facility and effectively form the high-quality gate insulating film 4.

INDUSTRIAL APPLICABILITY

As thus described, according to the present invention, it is possible to suppress deterioration in transistor characteristics and an increase in interface layer due to a gate insulating film, so as to produce a high-quality MIS transistor.

What is claimed is:

1. A semiconductor device comprising:
    a silicon substrate;
    an interface layer provided on the silicon substrate, the interface layer comprising a metal silicate;
    a diffusion suppressing layer provided on the interface layer; and
    a high dielectric constant insulating film provided on the diffusion suppressing layer;
    wherein the diffusion suppressing layer comprises nitrogen and a high-k metal element different from a metal constitutional element of the high dielectric constant insulating film.

2. A semiconductor device as in claim 1, wherein the interface layer has an equivalently converted $SiO_2$ thickness of 1.0 nm or smaller.

3. A semiconductor device as in claim 1, wherein a high dielectric constant metal constitutional element of the high dielectric constant insulating film is the same as a high dielectric constant metal constitutional element of the interface layer.

4. A method for manufacturing a semiconductor device comprising:
    forming, on one surface of a silicon substrate, an initial layer which is a high dielectric constant metal element film for being mutually diffused with silicon in the silicon substrate;
    forming a diffusion suppressing layer on the surface of the initial layer;
    performing heat treatment to allow the high dielectric constant metal element film of the initial layer to be mutually diffused with silicon in the silicon substrate, thereby forming an interface layer comprising a metal silicate; and
    forming a high dielectric constant insulating film on the surface of the diffusion suppressing layer;
    wherein the diffusion suppressing layer comprises nitrogen and a high-k metal element different from a metal constitutional element of the high dielectric constant insulating film.

5. A method for manufacturing a semiconductor device comprising:
    forming, on one surface of a silicon substrate, an initial layer which is a high dielectric constant metal element film for being mutually diffused with silicon in the silicon substrate;
    forming a diffusion suppressing layer on the surface of the initial layer;
    forming a high dielectric constant insulating film on the surface of the diffusion suppressing layer; and
    performing heat treatment to allow the high dielectric constant metal element film of the initial layer to be mutually diffused with silicon in the silicon substrate, thereby forming an interface layer comprising a metal silicate;
    wherein the diffusion suppressing layer comprises nitrogen and a high-k metal element different from a metal constitutional element of the high dielectric constant insulating film.

6. A semiconductor device as in claim 2, wherein a high dielectric constant metal constitutional element of the high dielectric constant insulating film is the same as a high dielectric constant metal constitutional element of the interface layer.

7. A semiconductor device as in claim 1, wherein the silicon substrate immediately below the interface layer and the high dielectric constant insulating film comprise a same metal constitutional element.

8. A method as in claim 4, wherein the silicon substrate immediately below the interface layer and the high dielectric constant insulating film comprise a same metal constitutional element.

9. A method as in claim 5, wherein the silicon substrate immediately below the interface layer and the high dielectric constant insulating film comprise a same metal constitutional element.

* * * * *